US012731630B2

(12) United States Patent
Shin et al.

(10) Patent No.: US 12,731,630 B2
(45) Date of Patent: Sep. 8, 2026

(54) NONVOLATILE MEMORY DEVICE FOR PERFORMING MULTI-PLANE READ OPERATION AND OPERATION METHOD THEREOF

(71) Applicant: Samsung Electronics Co., Ltd., Suwon-si (KR)

(72) Inventors: Yeji Shin, Suwon-si (KR); Seokin Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 18/495,202

(22) Filed: Oct. 26, 2023

(65) Prior Publication Data

US 2024/0203478 A1 Jun. 20, 2024

(30) Foreign Application Priority Data

Dec. 16, 2022 (KR) ........................ 10-2022-0177046

(51) Int. Cl.

| | |
|---|---|
| ***G11C 16/26*** | (2006.01) |
| ***G11C 11/4074*** | (2006.01) |
| ***G11C 11/4076*** | (2006.01) |
| ***G11C 11/408*** | (2006.01) |
| ***G11C 11/4096*** | (2006.01) |

(52) U.S. Cl.

CPC ...... *G11C 11/4074* (2013.01); *G11C 11/4076* (2013.01); *G11C 11/4087* (2013.01); *G11C 11/4096* (2013.01)

(58) Field of Classification Search

CPC ............ G11C 11/4074; G11C 11/4076; G11C 11/4087; G11C 11/4096; G11C 16/08; G11C 16/26

See application file for complete search history.

(56) References Cited

U.S. PATENT DOCUMENTS

| | | | | |
|---|---|---|---|---|
| 6,178,132 | B1 | 1/2001 | Chen et al. | |
| 9,698,676 | B1 * | 7/2017 | Huynh | H02M 3/07 |
| 10,120,404 | B2 | 11/2018 | Tanadi | |
| 10,497,447 | B2 | 12/2019 | Shin | |

(Continued)

FOREIGN PATENT DOCUMENTS

| | | |
|---|---|---|
| KR | 10-2018-0045102 A | 5/2018 |
| KR | 10-2018-0085418 A | 7/2018 |

OTHER PUBLICATIONS

Korean Office Action dated Jul. 29, 2026 issued in Korean Patent Application No. 10-2022-0177046 and its English Machine translation.

*Primary Examiner* — Mushfique Siddique

(74) *Attorney, Agent, or Firm* — HARNESS, DICKEY & PIERCE, P.L.C

(57) ABSTRACT

A nonvolatile memory device includes a cell array divided into a plurality of planes, a voltage generator configured to generate a word line voltage applied to word lines of each of the plurality of planes, a row decoder configured to transmit the word line voltage to the cell array in response to an address, and a control circuit configured to set up voltages of word lines of each of the plurality of planes to the word line voltage in response to an activated pseudo plane independent read mode setting. The control circuit is configured to sequentially shift voltage setup times of the word lines by a specified time delay corresponding to a number of the plurality of planes.

19 Claims, 13 Drawing Sheets

(56) References Cited

U.S. PATENT DOCUMENTS

| | | | | |
|---|---|---|---|---|
| 10,685,720 | B2 | 6/2020 | Oshiyama | |
| 10,796,773 | B1 * | 10/2020 | Piccardi | G11C 5/144 |
| 10,877,696 | B2 | 12/2020 | Wakchaure et al. | |
| 11,037,635 | B1 * | 6/2021 | Lien | G11C 16/10 |
| 11,322,209 | B2 | 5/2022 | Piccardi et al. | |
| 2017/0365335 | A1 * | 12/2017 | Wang | G11C 16/08 |
| 2018/0113803 | A1 * | 4/2018 | Kim | G06F 3/061 |
| 2018/0203796 | A1 * | 7/2018 | Park | G11C 16/3459 |
| 2019/0227749 | A1 * | 7/2019 | Wakchaure | G06F 3/0604 |
| 2022/0147480 | A1 | 5/2022 | Guo | |
| 2024/0013837 | A1 * | 1/2024 | Jeon | G11C 16/16 |

* cited by examiner

Figure 1:
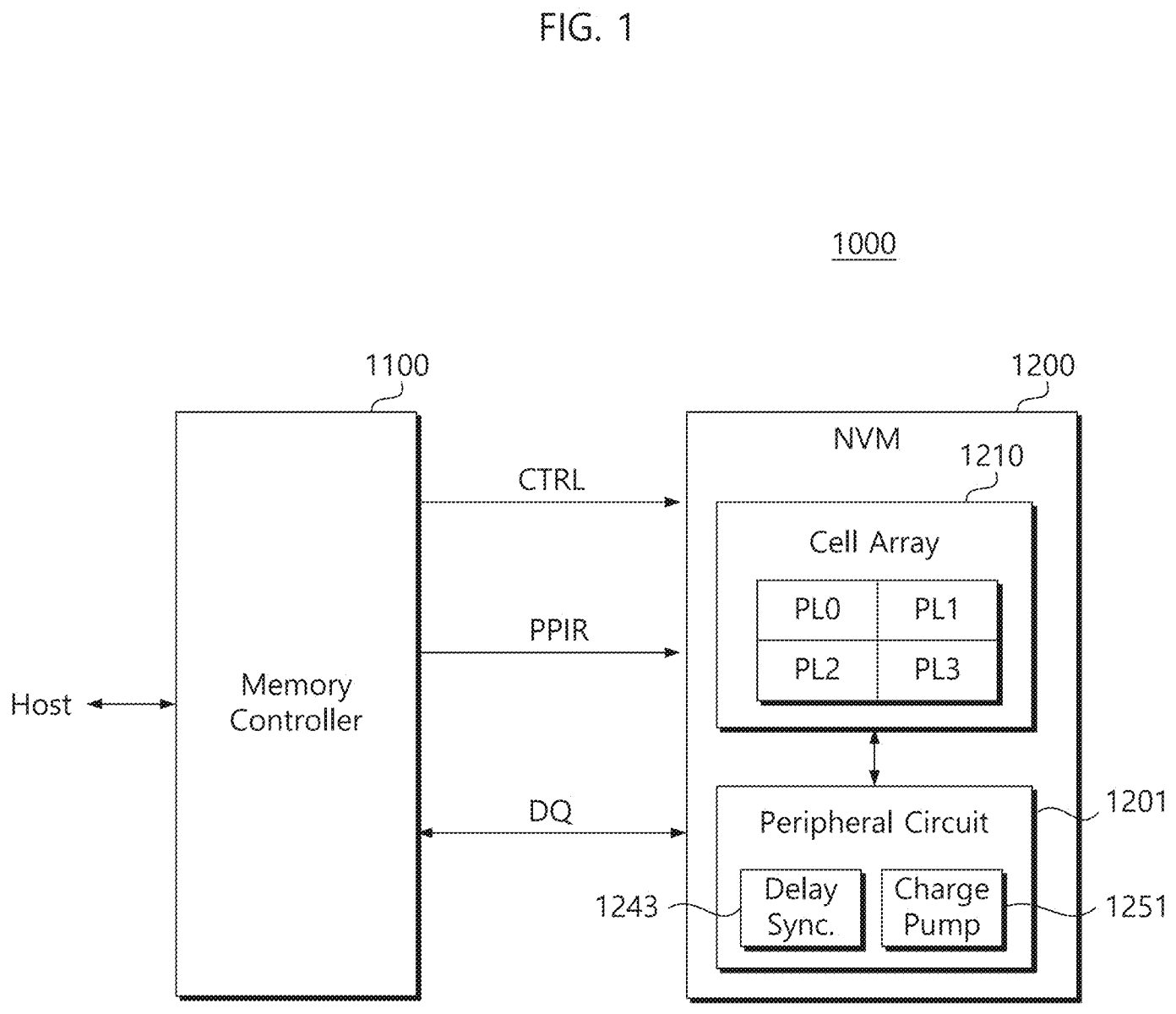

1200
NVM
1210
Cell Array
PL0
PL1
PL2
PL3
1201
Peripheral Circuit
1251
Charge Pump
Delay Sync.
1243

1100
Memory Controller

CTRL
PPIR
DQ
Host

Figure 2:
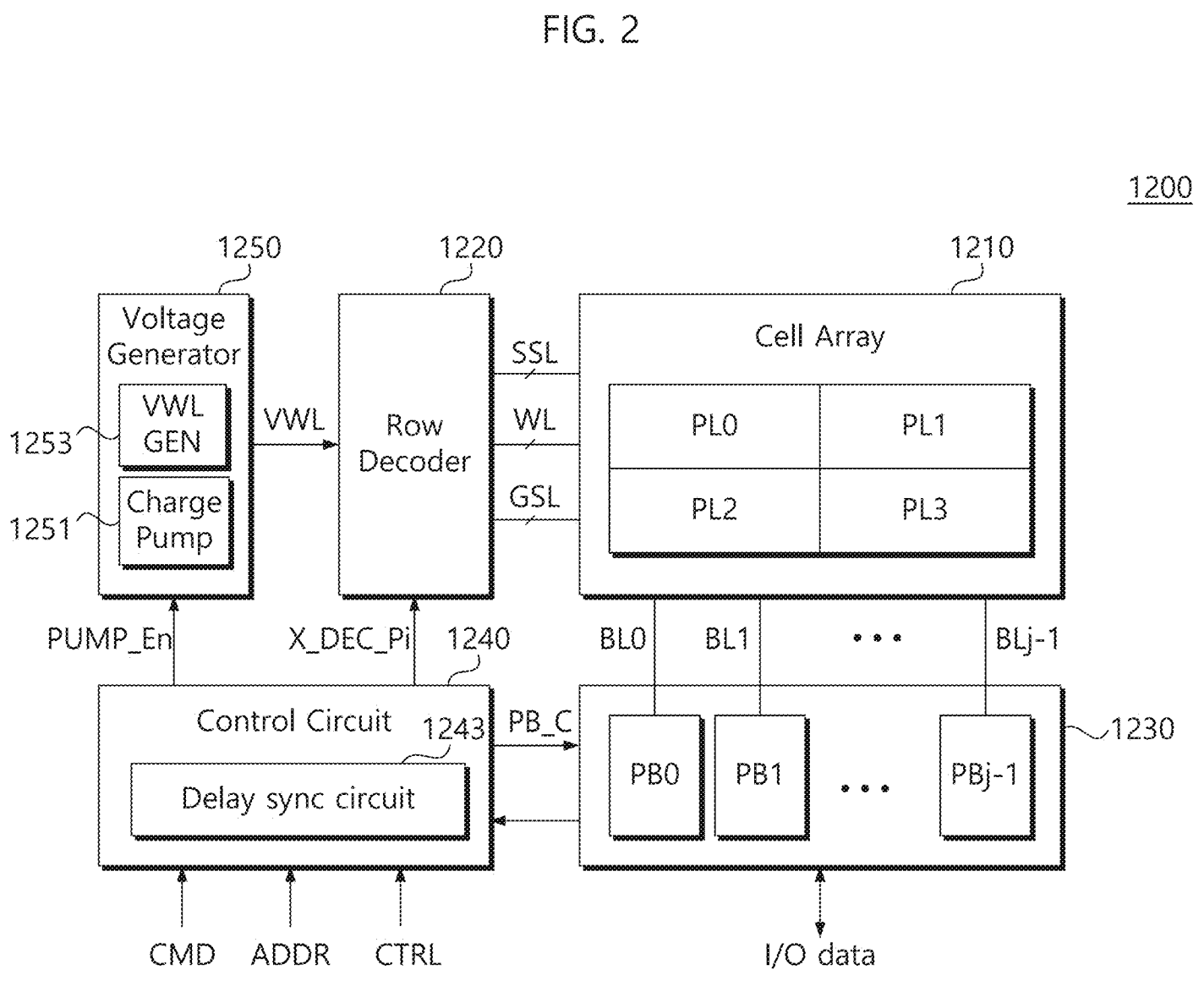

1210
Cell Array
PL0
PL1
PL2
PL3

1220
Row Decoder

SSL
WL
GSL

1230
BL0
BL1
BLj-1
PB0
PB1
PBj-1
I/O data

1240
Control Circuit
1243
Delay sync circuit
PB_C
X_DEC_Pi
PUMP_En
CMD
ADDR
CTRL 1250
Voltage Generator
VWL GEN
Charge Pump
VWL
1253
1251

BLK
WLs
GSL3
GSL2
GSL1
GSL0
VD
HD1
HD2
BL0
BL1
BL2
BL3
SSL3
SSL2
SSL1
SSL0
CSL
SUB
Perpendicular Direction
CS
SST
MC
GST X_DEC_P2
X_DEC_P0
X_DEC_P1
X_DEC_P3
PB_CTRL_P0
PB_CTRL_P1
PB_CTRL_P2
PB_CTRL_P3
PL0
PL1
PL2
PL3
PB (P0)
PB (P1)
PB (P2)
PB (P3)
X-DEC0
X-DEC1
X-DEC2
X-DEC3
WL_BLK0
WL_BLK1
WL_BLKm
n
VWL_P0
VWL_P1
VWL_P2
VWL_P3

NONVOLATILE MEMORY DEVICE FOR PERFORMING MULTI-PLANE READ OPERATION AND OPERATION METHOD THEREOF

CROSS-REFERENCE TO RELATED APPLICATION

This application claims priority under 35 U.S.C. § 119 to Korean Patent Application No. 10-2022-0177046 filed on Dec. 16, 2022, in the Korean Intellectual Property Office, the disclosure of which is incorporated by reference herein in its entireties.

FIELD

Some example embodiments of the inventive concepts described herein relate to a semiconductor memory device, including a nonvolatile memory device that performs a multi-plane read operation and an operating method thereof.

BACKGROUND

Semiconductor memory devices can be largely classified into volatile memory and non-volatile memory. Volatile memory (e.g., DRAM or SRAM) has a high reading and writing speed, but stored data disappears when a power supply is cut off. On the other hand, nonvolatile memory can retain stored data even if the power supply is interrupted.

An example of nonvolatile memory is a flash memory. A flash memory may store multi-bit data of two or more bits in one memory cell. A flash memory storing multi-bit data may have one erase state and a plurality of program states according to threshold voltage distribution. Flash memory desires or requires various levels of high voltage to read or write multi-bit data.

Flash memory can generate various levels of high voltage required for reading or writing using a charge pump. For example, a flash memory desires requires a high voltage program voltage or pass voltage to perform a program operation. The flash memory desires or requires a read voltage or a read pass voltage to perform a read operation.

Meanwhile, with the development of flash memory technology, the number of vertically stacked word lines is rapidly increasing. As the number of word line stages increases, the load of the charge pump during read operation also increases. However, it is not easy to increase a peripheral area where a charge pump is formed in a memory device to which Cell Over Peri (COP) technology is applied. In particular, a current peak of the flash memory occurs during a word line setup period of a read operation. As the number of word lines increases, the current peak generated during a read operation naturally increases. If the word line setup time is reduced to cope with the increasing current peak, the read speed is degraded. Accordingly, there is a need for a technology capable of reducing a current peak generated during a read operation of a flash memory.

SUMMARY

Some example embodiments of the inventive concepts provide a nonvolatile memory device having a multi-plane structure capable of reducing a current peak during a read operation. Some example embodiments of the inventive concepts provide a nonvolatile memory device that executes a multi-plane read command without deteriorating read performance.

According to an example embodiment, a nonvolatile memory device includes a cell array divided into a plurality of planes, a voltage generator configured to generate a word line voltage applied to word lines of each of the plurality of planes, a row decoder configured to transmit the word line voltage to the cell array in response to an address, and a control circuit configured to set up voltages of word lines of each of the plurality of planes to the word line voltage in response to an activated pseudo plane independent read mode setting. The control circuit is configured to sequentially shift voltage setup times of the word lines by a specified time delay corresponding to a number of the plurality of planes.

According to an example embodiment, a method for operating a nonvolatile memory device including a plurality of planes includes receiving an input command, determining whether a pseudo plane independent read mode is activated in response to the input command, and in response to determining that the pseudo plane independent read mode is activated, setting up voltages of word lines of each of the plurality of planes to a specified word line voltage. Voltage setup times of the word lines are sequentially shifted by a specified time delay corresponding to a number of the plurality of planes.

According to an example embodiment, a nonvolatile memory device includes a cell array including a first plane and a second plane, a first plane row decoder configured to transmit a word line voltage to the first plane, a second plane row decoder configured to transmit the word line voltage to the second plane, and a control circuit configured to set up voltages of word lines of the first plane and the second plane with the word line voltage at different points of time in response to a multi-plane read command.

BRIEF DESCRIPTION OF THE FIGURES

The above and other features of the inventive concepts will become apparent by describing in detail example embodiments thereof with reference to the accompanying drawings.

FIG. 1 is a block diagram showing a storage device according to an example embodiment of the inventive concepts.

FIG. 2 is a block diagram illustrating the nonvolatile memory device shown in FIG. 1 as an example embodiment.

FIG. 9 is a timing diagram illustrating a pseudo independent plane read (PPIR) mode and the setup of word line voltages of planes according to the PPIR mode, according to an example embodiment of the inventive concepts.

DETAILED DESCRIPTION

Figure 3:
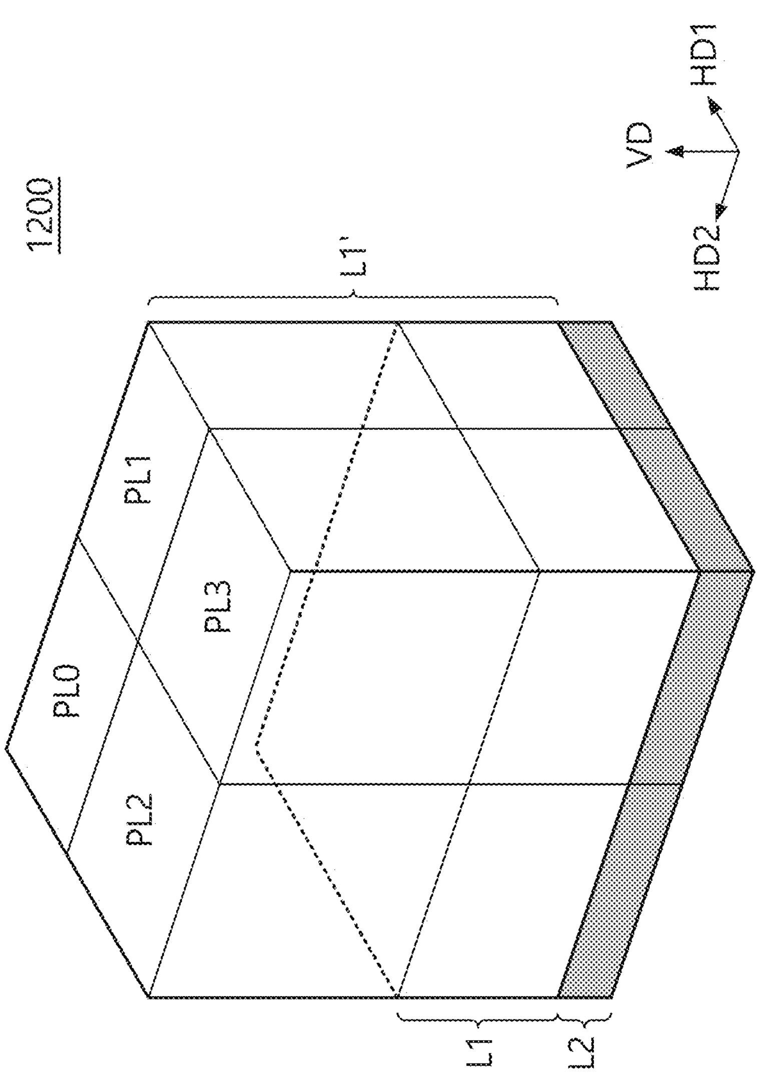
FIG. 3 is a block diagram schematically showing the structure of a nonvolatile memory device according to an example embodiment of the inventive concepts.

It is to be understood that both the foregoing general description and the following detailed description are examples of the inventive concepts. Reference signs are indicated in detail in example embodiments of the inventive concepts, examples of which are indicated in the reference drawings. Wherever possible, the same reference numbers are used in the description and drawings to refer to the same or like parts.

FIG. 1 is a block diagram showing a storage device according to an example embodiment of the inventive concepts. Referring to FIG. 1, a storage device 1000 may include a memory controller 1100 and a nonvolatile memory device 1200. The storage device 1000 may store data in the nonvolatile memory device 1200 under the control of the memory controller 1100. For example, each of the storage controller 1100 and the nonvolatile memory device 1200 may be provided as one chip, one package, or one module. Alternatively, the storage controller 1100 and the nonvolatile memory device 1200 are formed as one chip, one package, or one module, and may be used as an embedded memory, a memory card, a memory stick, or a solid state drive SSD and the like, and may be provided as storage.

The memory controller 1100 may perform an access operation of writing data to the nonvolatile memory device 1200 or reading data stored in the nonvolatile memory device 1200 according to a request of a host. The memory controller 1100 may generate a command CMD, an address ADDR, and a control signal CTRL to access the nonvolatile memory device 1200.

The memory controller 1100 may provide a multi-plane read (MPR) command to the nonvolatile memory device 1200. That is, the memory controller 1100 may provide a multi-plane read command (hereinafter referred to as MPR CMD) for reading data from a plurality of planes for the selected row. In particular, the memory controller 1100 performs a pseudo-plane independent read (PPIR) operation capable of sequentially delaying word line setup times for each plane during a multi-plane read operation. That is, during a read operation on a plurality of planes, the memory controller 1100 may provide a pseudo plane independent read (PPIR) operation to the nonvolatile memory device 1200 to sequentially delay the word line setup time of each plane. The memory controller 1100 may activate a pseudo independent plane read PPIR mode using a set feature.

The nonvolatile memory device 1200 may include a cell array 1210 and a peripheral circuit 1201. The cell array 1210 includes a plurality of planes PL0, PL1, PL2, and PL3 each including a plurality of memory blocks. Each of the plurality of memory blocks may have a vertical 3D structure. Each memory block may include a plurality of memory cells.

The cell array 1210 may be located on the side or top of the peripheral circuit 1201 in terms of the design layout structure. A structure in which the cell array 1210 is positioned above the peripheral circuit 1201 is referred to as a Cell On Peripheral (COP) structure. Meanwhile, the cell array 1210 may be manufactured as a chip separate from the peripheral circuit 1201. An upper chip including the cell array 1210 and a lower chip including the peripheral circuit 1201 may be connected to each other by a bonding method. Such a structure is called a chip to chip (C2C) structure.

The peripheral circuit 1201 may include all analog circuits or digital circuits desired or required to store data in the cell array 1210 or read data stored in the cell array 1210. The peripheral circuit 1201 may receive external power PWR from the memory controller 1100 and generate internal power (e.g., VCC) of various levels.

The peripheral circuit 1201 may receive commands, addresses, and data from the memory controller 1100 through the input/output line DQ. The peripheral circuit 1201 may store data in the cell array 1210 under the control of the control signal CTRL. Also, the peripheral circuit 1201 may read data stored in the cell array 1210 and provide the data to the memory controller 1100.

The peripheral circuit 1201 may receive a pseudo independent plane read (PPIR) mode activation request from the memory controller 1100 through a set feature. In addition, the peripheral circuit 1201 includes a delay synchronization circuit 1243 and a charge pump 1251 to perform a pseudo independent plane read (PPIR) operation after the pseudo plane independent read (PPIR) mode is activated by the set feature setting. The delay synchronization circuit 1243 controls timing such that word line setup times of each of a plurality of planes are sequentially shifted to perform a pseudo independent plane read PPIR operation. When setup temporarily occurs in each word line of a plurality of planes, a relatively large current peak occurs due to a large load. On the other hand, when pseudo plane independent read (PPIR) using the delay synchronization circuit 1243 of the inventive concepts is executed, word line setup of each plane is sequentially started to suppress generation of current peaks. Of course, if a general multi-plane read command (MPR CMD) is provided in the disabled state of the pseudo plane independent read (PPIR) mode, word line setup of all selected planes without shift of setup timing by the delay synchronization circuit 1243 may start at the same time.

The charge pump 1251 generates a voltage necessary for reading or writing a cell array. For example, the charge pump 1251 may boost an input voltage to a target level voltage in response to a clock signal. The word line voltage generated by the charge pump 1251 may be transferred to each memory block of the respective planes PL0, PL1, PL2, and PL3.

In the above, the configuration of the storage device 1000 of the example embodiment has been briefly described. In particular, the nonvolatile memory device 1200 of the example embodiment may sequentially delay setup of word lines of planes by a time difference tDelay for the pseudo plane independent read (PPIR) operation. The time difference tDelay at this time may preferably correspond to a word line setup time in units of planes or an output time tDOUT of read data.

FIG. 2 is a block diagram illustrating the nonvolatile memory device shown in FIG. 1. Referring to FIG. 2, the nonvolatile memory device 1200 includes a cell array 1210, a row decoder 1220, a page buffer circuit 1230, a control circuit 1240, and a voltage generator 1250.

The cell array 1210 includes a plurality of planes PL0, PL1, PL2, and PL3 each including a plurality of memory blocks. Each of the plurality of memory blocks may have a vertical 3D structure. Each memory block may be composed of a plurality of pages. Each page may include a plurality of memory cells. Multi-bit data may be stored in each memory cell. Each memory block is an erase unit, and each page may be a read or write unit.

The cell array 1210 may be formed in a direction perpendicular or substantially perpendicular to the substrate. A gate electrode layer and an insulation layer may be alternately deposited on the substrate. Each memory block may be connected to a string select line (SSL), a plurality of word lines, and a ground select line (GSL). The number of stacked gate electrode films on which the word lines of the cell array 1210 are formed increases as product generations develop. Accordingly, the capacity of the charge pump 1251 for driving the word lines may be increased along with the increase in the number of word lines integrated in the same chip area. However, when the COP or C2C technology is applied, the area of the periphery area in which the peripheral circuit 1220 (e.g., see FIG. 1) is integrated is substantially reduced.

The row decoder 1220 may select a word line of the cell array 1210 in response to the row address ADDR. The row decoder 1220 provides the word line voltage (VWL) provided from the voltage generator 1250 to the cell array 1210 through the select lines SSL and GSL and the word line WL. The row decoder 1220 may select a word line during a program or read operation. The row decoder 1220 may provide a program voltage or a read voltage to the selected word line.

The page buffer circuit 1230 may be connected to the cell array 1210 through bit lines BL0 to BLj−1, where j is a positive integer. The page buffer circuit 1230 may precharge or sense the bit lines BL0 to BLj−1 connected to memory cells in response to the page buffer control signal PB_C provided from the control circuit 1240. The page buffer circuit 1230 may include a plurality of page buffers PB0 to PBj−1. The plurality of page buffers PB0 to PBj−1 may be respectively connected to memory cells through a plurality of bit lines BL0 to BLj−1. The page buffer circuit 1230 may operate as a write driver or a sense amplifier according to an operation mode. For example, during a program operation, the page buffer circuit 1230 may apply a bit line voltage corresponding to data to be programmed to a selected bit line. During a read operation, the page buffer circuit 1230 may sense data stored in a memory cell by sensing a current or voltage of a selected bit line.

The control circuit 1240 may control various operations in the nonvolatile memory device 1200 according to modes. The control circuit 1240 may perform a program, read, or erase operation on the cell array 1210 in response to a control signal CTRL, a command CMD, and/or an address ADDR. For example, the control circuit 1240 may generate a pump enable signal PUMP_En, a page buffer control signal PB_C, and the like for a program operation. The control circuit 1240 may provide the pump enable signal PUMP_En to the voltage generator 1250 to generate voltages desired or required for read, write, and erase operations.

The control circuit 1240 may include a command decoder, an address buffer, and a delay synchronization circuit 1243. In particular, the delay synchronization circuit 1243 may control the row decoder 1220 to sequentially delay the setup of word lines of respective planes by a time difference tDelay during a pseudo plane independent read (PPIR) operation. The delay synchronization circuit 1243 generates a plane setup control signal X_DEC_Pi for controlling a word line setup time of each plane in a pseudo independent plane read (PPIR) mode. The generated plane setup control signal X_DEC_Pi may be provided to the row decoder 1220.

The voltage generator 1250 may generate the word line voltage VWL desired or required to read or write data in response to the pump enable signal PUMP_En from the control circuit 1240. The word line voltage VWL may be provided to a selected word line (sWL) or an unselected word line (uWL) through the row decoder 1220. The voltage generator 1250 may include a charge pump 1251 and a word line voltage generator 1253 for this purpose. The word line voltage generator 1253 may generate the word line voltage provided during a program operation or the word line voltage provided during a read operation.

In the above, according to the nonvolatile memory device 1200 of the example embodiment, in the pseudo plane independent read (PPIR) mode, the control circuit 1240 may generate the plane setup control signal X_DEC_Pi to sequentially delay the setup of word lines of each plane by a time difference tDelay. Accordingly, the word line setup time of each of the selected planes is sequentially delayed by a specific time difference tDelay. Accordingly, it is possible to reduce the size of a current peak generated when the word lines are set up at one time.

FIG. 3 is a block diagram schematically showing the structure of a nonvolatile memory device according to an example embodiment of the inventive concepts. Referring to FIG. 3, the nonvolatile memory device 1200 may include a first semiconductor layer L1 and a second semiconductor layer L2. The first semiconductor layer L1 may be stacked in a vertical direction VD with respect to the second semiconductor layer L2. Specifically, the second semiconductor layer L2 may be disposed below the first semiconductor layer L1 in a vertical direction VD, and thus, the second semiconductor layer L2 may be disposed close to the substrate.

In an example embodiment, the cell array 1210 of FIG. 2 may be formed on the first semiconductor layer L1, and the peripheral circuit 1201 corresponding to the row decoder 1220, the page buffer circuit 1230, the control circuit 1240, and the voltage generator 1250 of FIG. 2 may be formed on the second semiconductor layer L2. Accordingly, the nonvolatile memory device 1200 may have a structure in which the cell array 1210 is disposed above the peripheral circuit (e.g., 1220, 1230, 1240, and 1250), that is, a Cell Over Periphery (COP) structure. The COP structure can effectively reduce an area in a horizontal direction and improve the degree of integration of the nonvolatile memory device 1200.

In an example embodiment, the second semiconductor layer L2 may include a substrate, and peripheral circuits (1220, 1230, 1240, 1250) may be formed on the substrate by forming transistors and metal patterns for wiring the transistors on the substrate. After the peripheral circuits (1220, 1230, 1240, 1250) are formed on the second semiconductor layer L2, the first semiconductor layer L1 including the cell array 1210 may be formed. Metal patterns may be formed to electrically connect the word lines WL and bit lines BL of the cell array 1210 and the peripheral circuits 1220, 1230, 1240, and 1250 formed on the second semiconductor layer L2. For example, bit lines BL may extend in a first horizontal direction HD1, and word lines WL may extend in a second horizontal direction HD2.

Meanwhile, with the development of manufacturing technology, the number of vertically stacked word lines is rapidly increasing. Accordingly, the height of the first semiconductor layer L1 may increase as the number of word lines increases. That is, the first semiconductor layer L1 may be formed of an increased number of first semiconductor layers L1'. As the number of word lines increases, the burden of the charge pump formed in the second semiconductor layer L2 also increases. However, it is not easy to increase the area of a peripheral area where a charge pump is formed in a Cell Over Peri (COP) structure. In particular, a current peak generated during a word line setup operation of the nonvolatile memory device 1200 naturally increases as the number of word lines increases. The nonvolatile memory device 1200 of the present invention can reduce such a current peak without changing the structure of a charge pump 1251.

Figure 4:
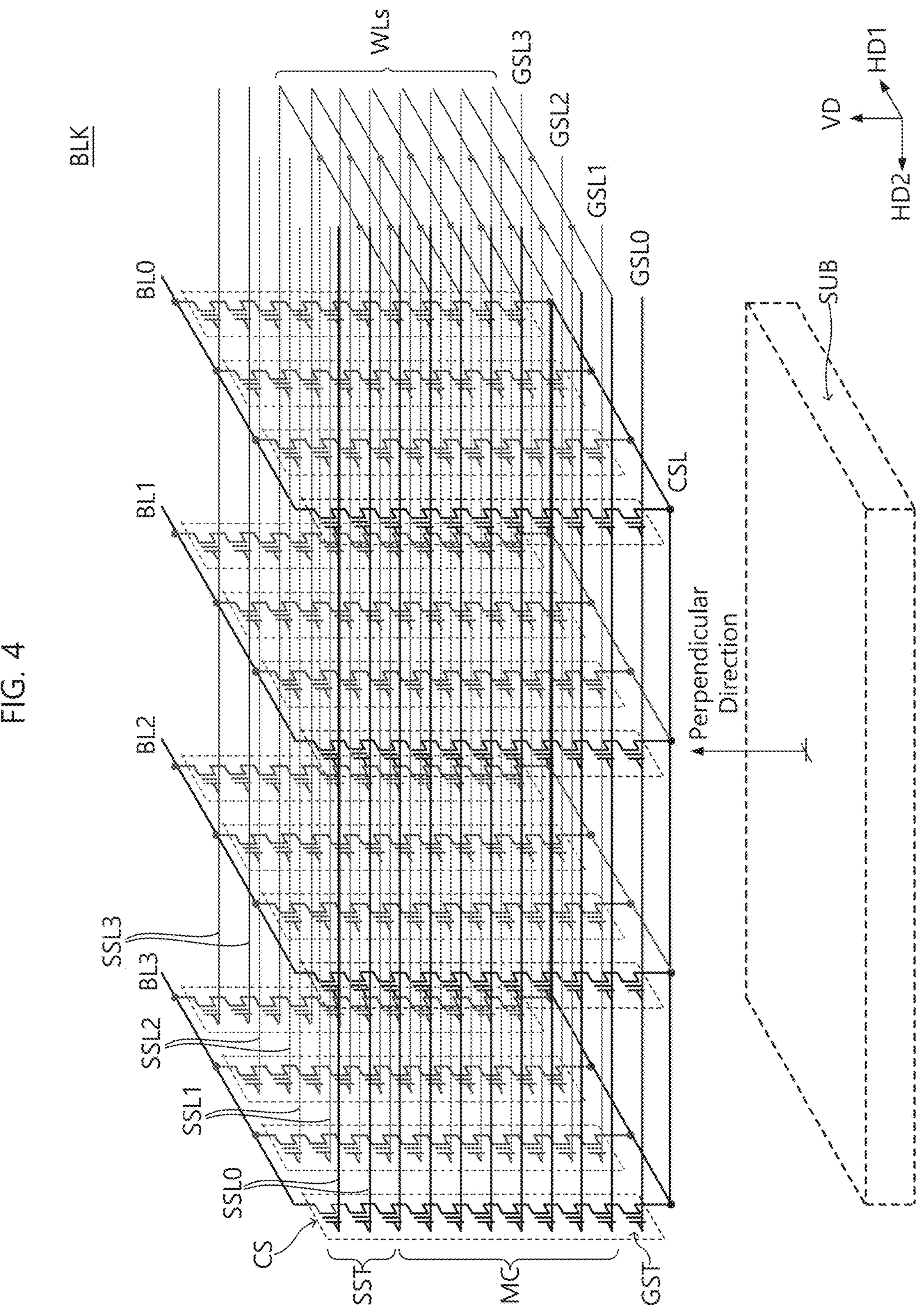
FIG. 4 is a circuit diagram showing an example structure of a memory block constituting the cell array of FIG. 2.

FIG. 4 is a circuit diagram showing an example structure of a memory block constituting the cell array of FIG. 2. Referring to FIG. 4, cell strings CS are formed between the bit lines BL0, BL1, BL2, and BL3 and the common source line CSL to form the memory block BLK.

A plurality of cell strings are formed between the bit line BL0 and the common source line CSL. The string select transistors SST of the cell strings CS are connected to the corresponding bit lines BL. The ground selection transistors GST of the cell strings CS are connected to the common source line CSL. Memory cells MCs are provided between the string select transistor SST and the ground select transistor GST of the cell string CS.

Each of the cell strings CS includes a ground select transistor GST. Ground select transistors included in the cell strings CS may be controlled by the ground select line GSL (e.g., GSL0, GSL1, GSL2, and GSL3 in FIG. 4). Alternatively, although not shown, cell strings corresponding to each row may be controlled by different ground selection lines.

In the above, the circuit structure of memory cells included in one memory block BLK has been briefly described. However, the illustrated circuit structure of the memory block is only a simplified structure for convenience of description, and an actual memory block is not limited to the illustrated example embodiment. That is, it will be well understood that more semiconductor layers, bit lines (BLs), and string select lines (SSLs, such as SSL0, SSL1, SSL2 and SSL3 of FIG. 4) may be included in one physical block.

Figure 5:
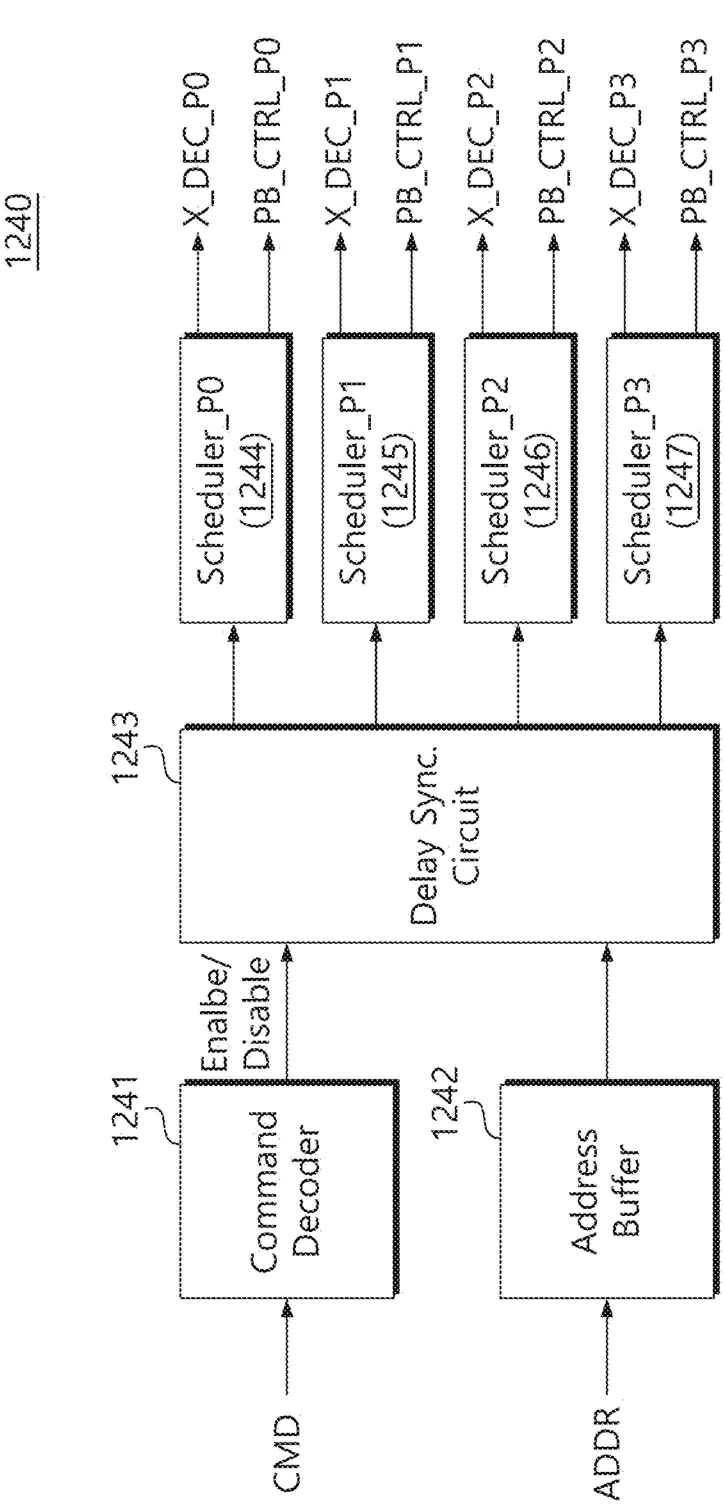
FIG. 5 is a block diagram showing the configuration of the control circuit shown in FIG. 2 in an example embodiment.

FIG. 5 is a block diagram showing the configuration of the control circuit shown in FIG. 2. Referring to FIG. 5, the control circuit 1240 may include a command decoder 1241, an address buffer 1242, a delay synchronization circuit 1243, and setup schedulers 1244, 1245, 1246, and 1247.

The command decoder 1241 decodes various commands input from the memory controller 1100. For example, the command decoder 1241 may decode a write command, a read command, and an erase command. According to the decoding result, the command decoder 1241 may control the voltage generator 1250, the row decoder 1220, or the page buffer circuit 1230 to execute the requested operation. In particular, the command decoder 1241 enables or disables the delay synchronization circuit 1243 according to whether a pseudo plane independent read (PPIR) mode is activated.

The address buffer 1242 receives the address signal ADDR, provides the row address R_ADDR of the address signal ADDR to the row decoder 1220, and provides the column address C_ADDR to a data input/output circuit (not shown).

When the pseudo plane independent read (PPIR) mode is activated, the delay synchronization circuit 1243 operates the setup schedulers 1244, 1245, 1246, and 1247 to sequentially delay setup of word lines of each of the planes by a time difference tDelay. Upon activation of the pseudo plane independent read (PPIR) mode, the delay synchronization circuit 1243 is enabled. Then, the delay synchronization circuit 1243 operates the setup schedulers 1244, 1245, 1246, and 1247 to sequentially delay the setup of each word line of the plurality of planes PL0, PL1, PL2, and PL3 by a time difference tDelay. On the other hand, if a general multi-plane read command (MPR CMD) is provided in a state where the pseudo plane independent read PPIR mode is deactivated, the delay synchronization circuit 1243 is disabled. Then, the delay synchronization circuit 1243 controls the setup schedulers 1244, 1245, 1246, and 1247 so that word line setup of each of the plurality of planes PL0, PL1, PL2, and PL3 occurs simultaneously.

The setup schedulers 1244, 1245, 1246, and 1247 generate a plane setup control signal X_DEC_Pi and a page buffer control signal PB_CTRL_Pi under the control of the delay synchronization circuit 1243. The page buffer control signal PB_CTRL_Pi is provided to the page buffer circuit 1230 and is used to control bit line pre-charging, setup, or sensing timing. For example, the page buffer circuit 1230 may control precharge and shutoff operations of bit lines according to the page buffer control signal PB_CTRL_Pi.

The plane setup control signal X_DEC_Pi is provided to the row decoders X-DECi (where i=0, 1, 2, and 3 in FIG. 5) of each of the plurality of planes PL0, PL1, PL2, and PL3. Also, the row decoder X-DECi switches the input word line voltage VWL according to the plane setup control signal X_DEC_Pi and transmits the switched word line voltage VWL to the word lines of the memory blocks. Here, the word line voltage VWL may be, for example, the read pass voltage Vread provided to the unselected word line uWL. In another example embodiment, the word line voltage VWL may be the read voltage Vrd provided to the selected word line sWL.

When the delay synchronization circuit 1243 is enabled, each of the plane setup control signals X_DEC_P0, X_DEC_P1, X_DEC_P2, and X_DEC_P3 is sequentially delayed and activated by a specific time difference tDelay. That is, at an enabling time of the delay synchronization circuit 1243, the plane setup control signal X_DEC_P1 corresponding to the second plane PL1 is activated with the time tDelay by more than the plane setup control signal X_DEC_P0 corresponding to the first plane PL0. Also, the plane setup control signal X_DEC_P2 corresponding to the third plane PL2 is delayed by the time tDelay and activated than the plane setup control signal X_DEC_P1 corresponding to the second plane PL1. Similarly, the plane setup control signal X_DEC_P3 corresponding to the fourth plane PL3 is delayed by the time tDelay and activated than the plane setup control signal X_DEC_P2 corresponding to the third plane PL2. The relationship between these plane setup control signals X_DEC_P0, X_DEC_P1, X_DEC_P2, and X_DEC_P3 will be described in more detail in the timing diagram of FIG. 9 to be described later.

Figure 6:
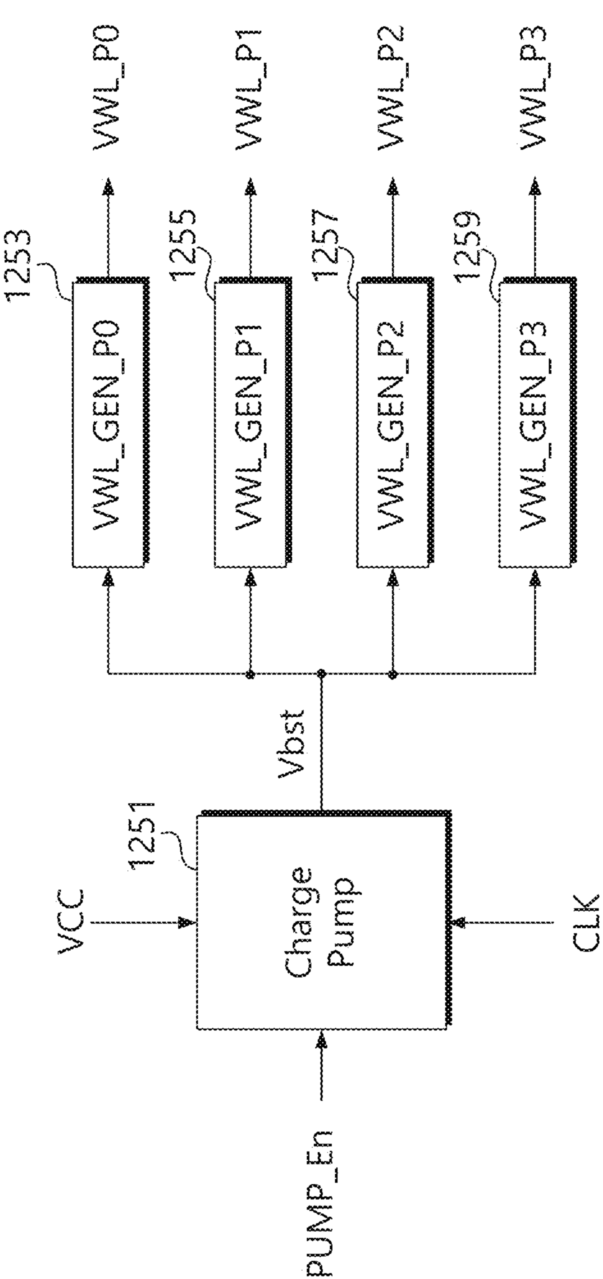
FIG. 6 is a block diagram briefly showing some example configurations of a voltage generator according to an example embodiment of the inventive concepts.

FIG. 6 is a block diagram briefly showing some configurations of a voltage generator according to an example embodiment of the inventive concepts. Referring to FIG. 6, a voltage generator 1250 may include a charge pump 1251 and a plurality of word line voltage generators 1253, 1255, 1257, and 1259.

The charge pump 1251 may operate in response to a pump enable signal PUMP_En provided from the control circuit 1240. The charge pump 1251 may receive the power supply voltage VCC and the clock signal CLK and provide the boosted voltage Vbst to the word line voltage generators 1253, 1255, 1257, and 1259. In general, the charge pump 1251 is a circuit that generates a reverse voltage or a voltage higher than an input voltage by charging a capacitor. Since the charge pump 1251 may be configured in various forms through various circuit configurations, a description thereof will be omitted below.

The word line voltage generators 1253, 1255, 1257, and 1259 generate the word line voltage VWL_Pi of each of the planes PL0, PL1, PL2, and PL3 using the boosted voltage Vbst provided from the charge pump 1251. The word line voltage generators 1253, 1255, 1257, and 1259 may, for example, generate a program voltage Vpgm provided to the selected word line sWL or a pass voltage Vpass provided to the unselected word line uWL in the program mode. Alternatively, the word line voltage generators 1253, 1255, 1257, and 1259 may output a read voltage Vrd provided to the selected word line sWL and a read pass voltage Vread provided to the unselected word line uWL in the read mode.

Figure 7:
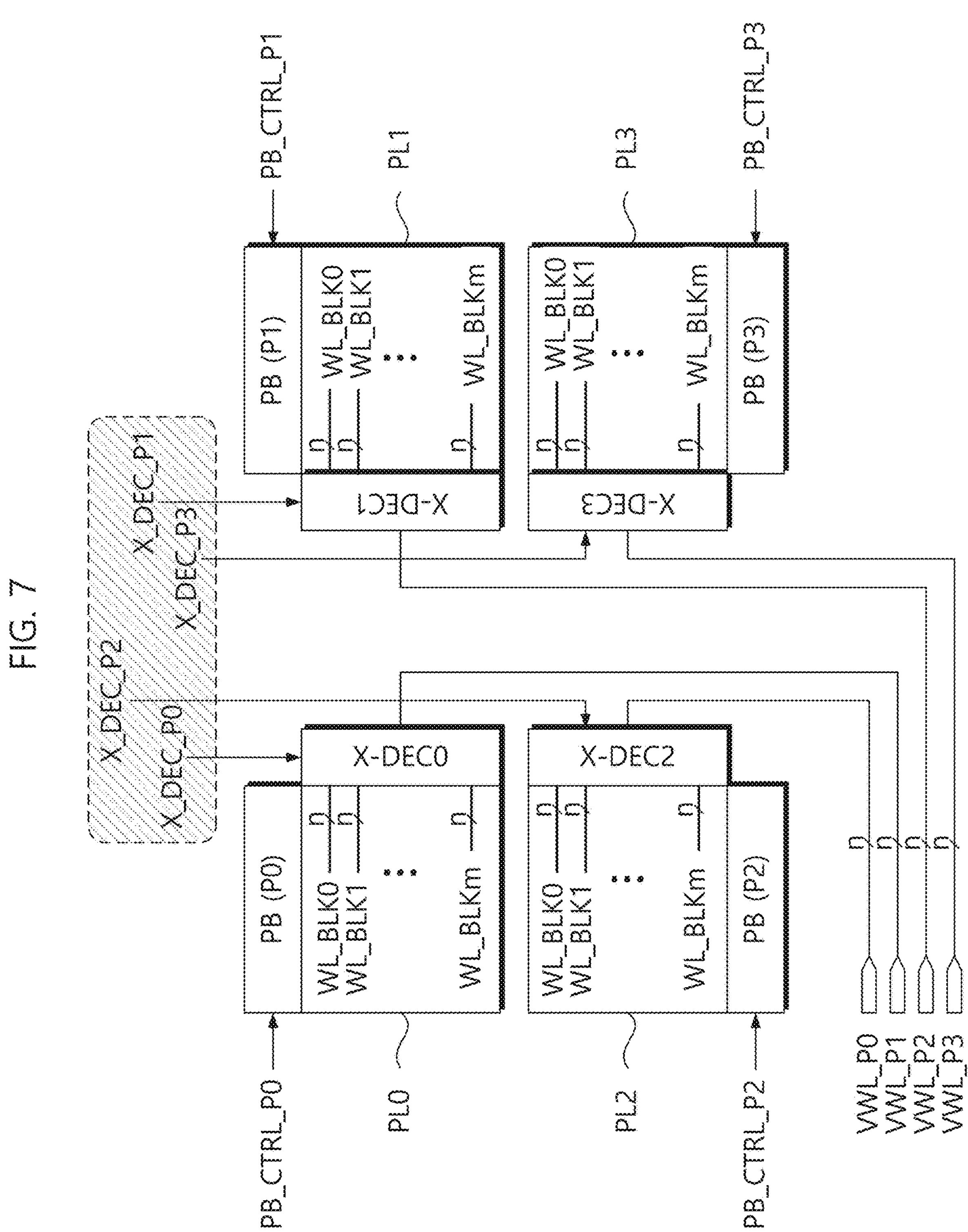
FIG. 7 is a block diagram illustrating the function of a plane setup control signal X_DEC_Pi according to an example embodiment of the inventive concepts.

FIG. 7 is a block diagram illustrating the function of a plane setup control signal X_DEC_Pi according to an example embodiment of the inventive concepts. Referring to FIG. 7, the word line voltage VWL_Pi may be shifted and transmitted to the word lines of the planes PL0, PL1, PL2, and PL3 by the plane setup control signals X_DEC_P0, X_DEC_P1, X_DEC_P2, and X_DEC_P3.

The word line voltages VWL_P0, VWL_P1, VWL_P2, and VWL_P3 generated from the word line voltage generators 1253, 1255, 1257, and 1259 are applied to the row decoders X-DEC0, X-DEC1, X-DEC2, and X-DEC3 of the planes PL0, PL1, PL2, and PL3. Then, each of the row decoders X-DEC0, X-DEC1, X-DEC2, and X-DEC3 transmits word line voltages VWL_P0, VWL_P1, VWL_P2, and VWL_P3 in response to the plane setup control signals X_DEC_P0, X_DEC_P1, X_DEC_P2, and X_DEC_P3 to the selected memory block.

For example, the first word line voltage VWL_P0 corresponding to the first plane P0 is transferred to the first row decoder X-DEC0. The first row decoder X-DEC0 transmits the first word line voltage VWL_P0 to word lines (e.g., WL_BLK1) of the selected block in response to the first plane setup control signal X_DEC_P0. Similarly, the second word line voltage VWL_P1 corresponding to the second plane P1 is transmitted to the second row decoder X-DEC1. The second row decoder X-DEC1 transmits the second word line voltage VWL_P1 to word lines (e.g., WL_BLK1) of the selected block in response to the second plane setup control signal X_DEC_P1. Also, the third word line voltage VWL_P2 corresponding to the third plane P2 is transmitted to the third row decoder X-DEC2. The third row decoder X-DEC2 transmits the third word line voltage VWL_P2 to word lines (e.g., WL_BLK1) of the selected block in response to the third plane setup control signal X_DEC_P2. The fourth word line voltage VWL_P3 corresponding to the fourth plane P3 is transmitted to the fourth row decoder X-DEC3. The fourth row decoder X-DEC3 transmits the fourth word line voltage VWL_P3 to word lines (eg, WL_BLK1) of the selected block in response to the fourth plane setup control signal X_DEC_P3.

As a result, when the plane setup control signals X_DEC_P0, X_DEC_P1, X_DEC_P2, and X_DEC_P3 are sequentially activated, the word line voltages VWL_P0, VWL_P1, VWL_P2, and VWL_P3 provided to the planes PL0, PL1, PL2, and PL3 will be set up sequentially.

Figure 8:
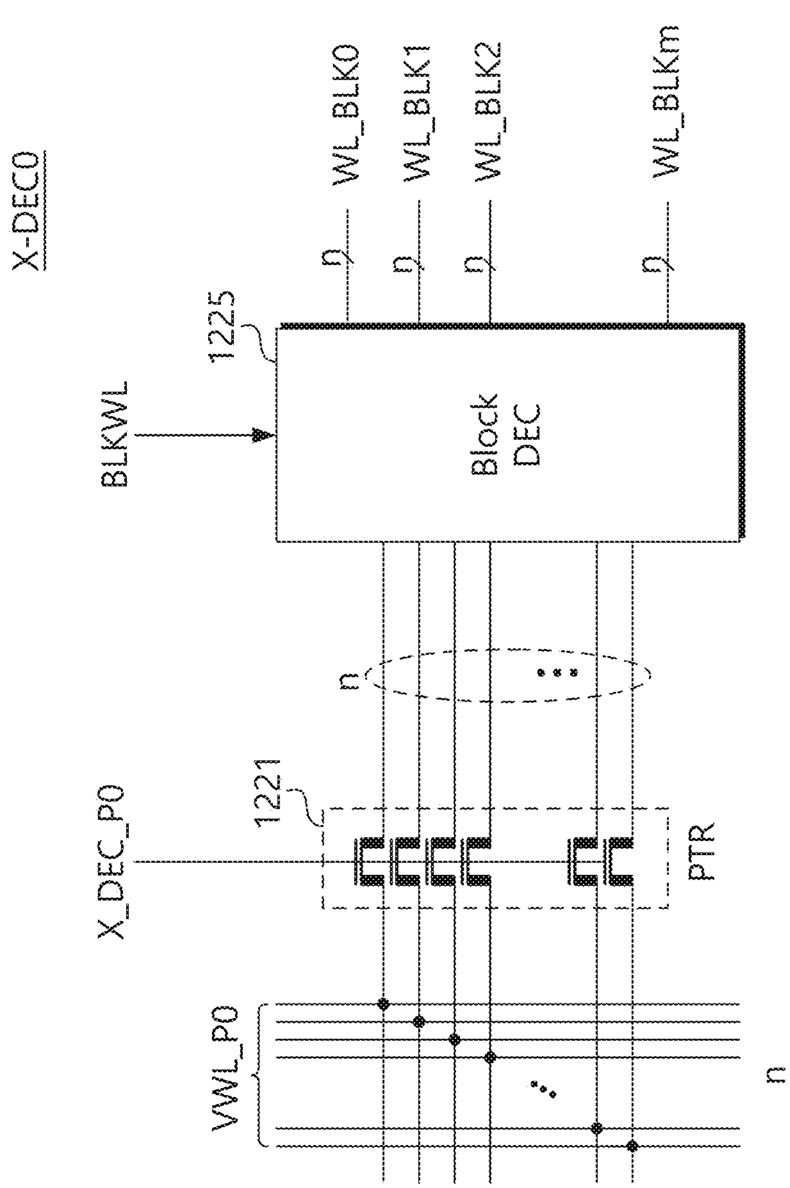
FIG. 8 is a circuit diagram showing an example first row decoder (X-DEC0), which is one of the row decoders of FIG. 7.

FIG. 8 is a circuit diagram showing a first row decoder (X-DEC0), which is one of the row decoders of FIG. 7. Referring to FIG. 8, the first row decoder X-DEC0 may include a plurality of pass transistors 1221 and a block decoder 1225. The first row decoder X-DEC0 transfers the first word line voltage VWL_P0 to the word line of the first planes PL0. In particular, the setup time of the first word line voltage VWL_P0 may be controlled by the first plane setup control signal X_DEC_P0.

The first word line voltage VWL_P0 corresponding to the first plane P0 is transferred to the first row decoder X-DEC0. Then, the plurality of pass transistors 1221 switches the first word line voltage VWL_P0 according to the first plane setup control signal X_DEC_P0. When the first plane setup control signal X_DEC_P0 is activated, the plurality of pass transistors 1221 are turned on, and the first word line voltage VWL_P0 is transmitted to the block decoder 1225. The block decoder 1225 transmits the first word line voltage VWL_P0 to one word line of a plurality of blocks in response to the block selection signal BLKWL.

When the plurality of pass transistors 1221 are turned on, word lines of the selected memory block are set up to the first word line voltage VWL_P0 level. When the plane setup control signals X_DEC_P0, X_DEC_P1, X_DEC_P2, and X_DEC_P3 are sequentially activated for the plurality of planes PL0, PL1, PL2, and PL3, the setup time is differentiated. Accordingly, a current peak generated by word line setup may be reduced by sequentially activating the plane setup control signals X_DEC_P0, X_DEC_P1, X_DEC_P2, and X_DEC_P3.

Figure 9:
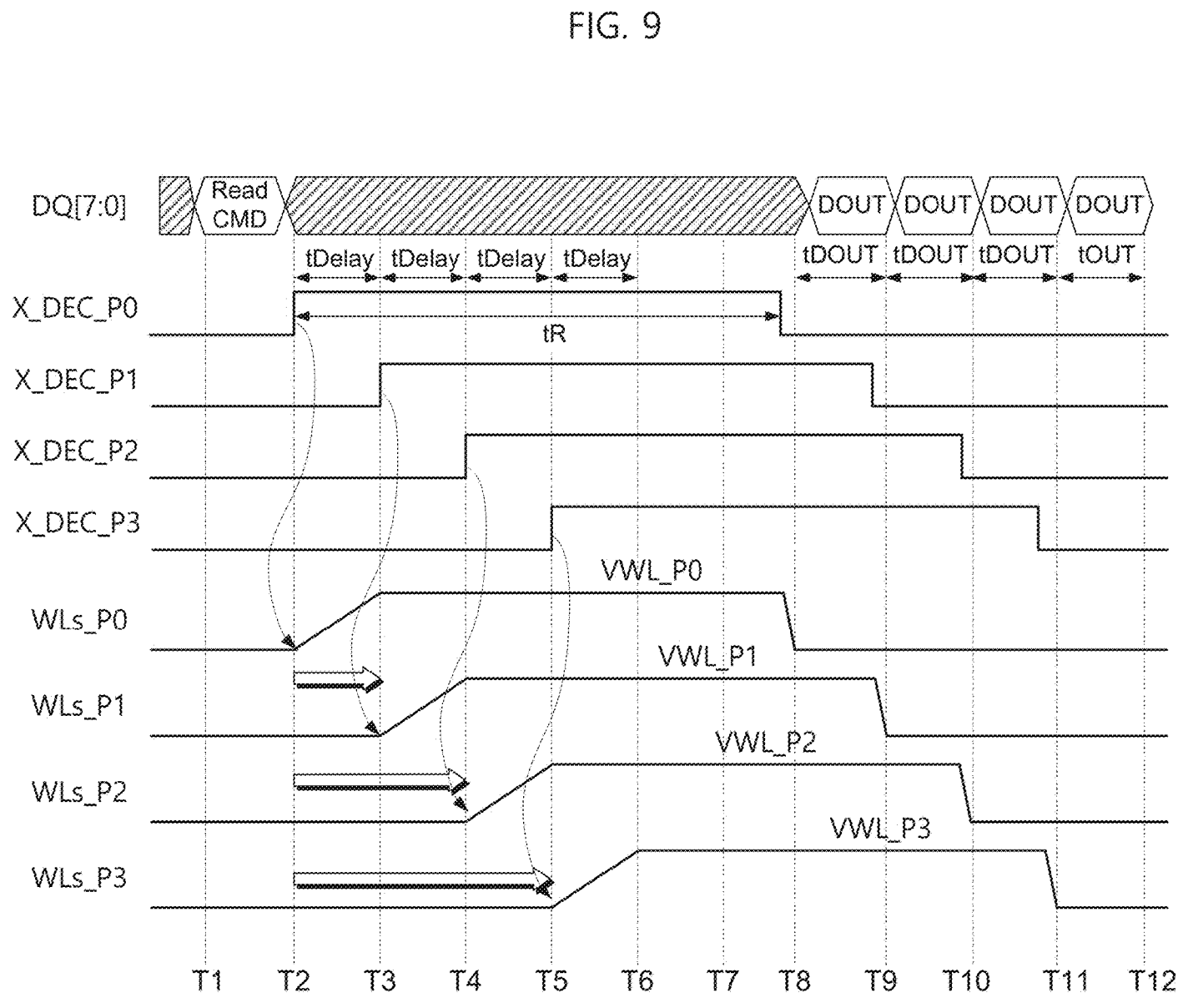

FIG. 9 is a timing diagram illustrating setup of word line voltages of planes in a pseudo plane independent read (PPIR) mode according to an example embodiment of the inventive concepts. Referring to FIG. 9, when the pseudo plane independent read (PPIR) mode is activated, plane setup control signals X_DEC_P0, X_DEC_P1, X_DEC_P2, and X_DEC_P3 are generated by the delay synchronization circuit 1243 (e.g., see FIG. 5). Hereinafter, it will be assumed that the pseudo plane independent read (PPIR) mode is activated through the set feature setting.

At the time T1, a read command Read CMD is input through the data input/output line DQ. The read command Read CMD at this time may be, for example, a multi-plane read command corresponding to a read request for a plurality of planes. Then, the read command Read CMD is decoded by the command decoder (1241, see FIG. 5), and the delay synchronization circuit 1243 is activated.

From time T2, the setup schedulers 1244, 1245, 1246, and 1247 sequentially activate the plane setup control signals X_DEC_P0, X_DEC_P1, X_DEC_P2, and X_DEC_P3 under the control of the delay synchronization circuit 1243. The setup control signals X_DEC_P0, X_DEC_P1, X_DEC_P2, and X_DEC_P3 are sequentially delayed by the delay time tDelay and activated.

At the time T2, the first plane setup control signal X_DEC_P0 corresponding to the first plane P0 is activated to a high level. Then, the first word line voltage VWL_P0 is transmitted to the first row decoder X-DEC0. The first row decoder X-DEC0 sets up the word lines WLs_P0 of the first plane P0 in response to the first plane setup control signal X_DEC_P0. Then, the voltage of the word lines WLs_P0 is set to the level of the first word line voltage VWL_P0 (e.g., at time T3). Data sensed in the first plane P0 will be output from the data input/output line DQ[7:0] during one output cycle tDOUT between the times T8 and T9.

At time T3, the second plane setup control signal X_DEC_P1 corresponding to the second plane P1 is activated to a high level. The second plane setup control signal X_DEC_P1 is activated after a delay time tDelay has elapsed from the first plane setup control signal X_DEC_P0. Then, the second word line voltage VWL_P1 is transmitted to the second row decoder X-DEC1. The second row decoder X-DEC1 sets up the word lines WLs_P1 of the second plane P1 by the second plane setup control signal X_DEC_P1. Then, the voltages of the word lines WLs_P1 are set to the level of the second word line voltage VWL_P1 (e.g., at time T4). Data sensed in the second plane P1 will be output from the data input/output line DQ[7:0] during one output cycle tDOUT between the times T9 and T10.

At the time T4, the third plane setup control signal X_DEC_P2 corresponding to the third plane P2 is activated to a high level. The third plane setup control signal X_DEC_P2 is activated after a delay of the second plane setup control signal X_DEC_P1 by the delay time tDelay. Then, the third word line voltage VWL_P2 is transmitted to the third row decoder X-DEC2. The third row decoder X-DEC2 sets up the word lines WLs_P2 of the third plane P2 according to the third plane setup control signal X_DEC_P2. Then, the voltages of the word lines WLs_P2 are set to the level of the third word line voltage VWL_P2 (e.g., at time T5). Data sensed in the third plane P2 will be output from the data input/output line DQ[7:0] during one output cycle tDOUT between the times T10 and T11.

At the time T5, the fourth plane setup control signal X_DEC_P3 corresponding to the fourth plane P3 is activated to a high level. The fourth plane setup control signal X_DEC_P3 is activated after a delay of the third plane setup control signal X_DEC_P2 by the delay time tDelay. Then, the fourth word line voltage VWL_P3 is transmitted to the fourth row decoder X-DEC3. The fourth row decoder X-DEC3 sets up the word lines WLs_P3 of the fourth plane P3 in response to the fourth plane setup control signal X_DEC_P3. Then, the voltages of the word lines WLs_P3 are set to the level of the fourth word line voltage VWL_P3 (e.g., at time T6). Data sensed in the fourth plane P3 will be output from the data input/output line DQ[7:0] during one output cycle tDOUT between the times T11 and T12.

As described above, through the sequential delay of the plane setup control signals X_DEC_P0, X_DEC_P1, X_DEC_P2, and X_DEC_P3, the output data DOUT can be output to the outside without delay. The delay time tDelay of each of the plane setup control signals X_DEC_P0, X_DEC_P1, X_DEC_P2, and X_DEC_P3 may correspond to the setup time of each word line WLs_P0, WLs_P1, WLs_P2, and WLs_P3 of the planes. In addition, the nonvolatile memory device 1200 may reduce a current peak caused by an increase in word line loading despite a multi-plane read operation.

Figure 10:
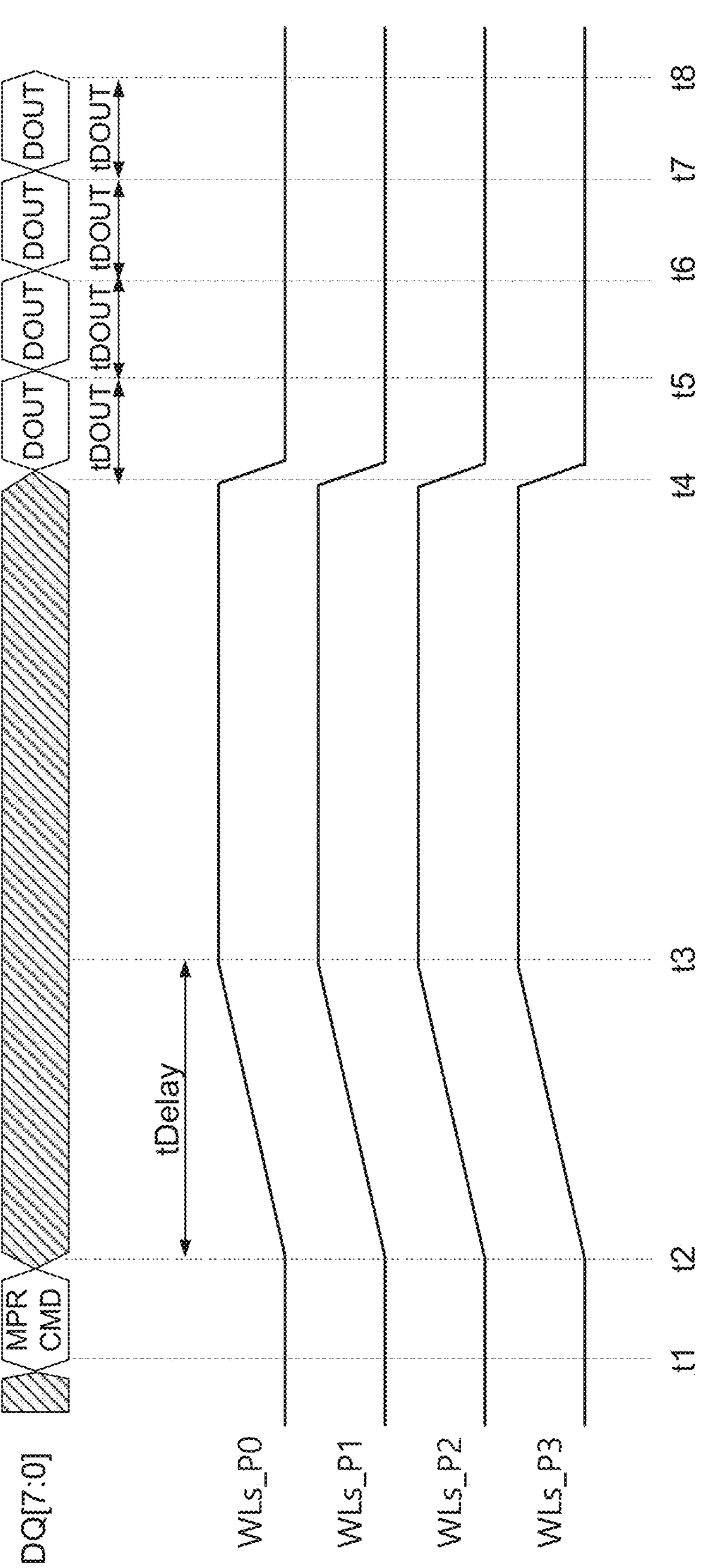
FIG. 10 is a timing diagram showing input of a general multi-plane read command (MPR CMD) and subsequent setup of word line voltages of respective planes.

FIG. 10 is a timing diagram showing input of a general multi-plane read command MPR CMD and subsequent word line voltage setup of each plane under a condition in which a pseudo plane independent read (PPIR) mode is disabled. Referring to FIG. 10, when the multi-plane read command MPR CMD is input, the delay synchronization circuit 1243 (e.g., see FIG. 5) is deactivated, and the plane setup control signals X_DEC_P0, X_DEC_P1, X_DEC_P2, and X_DEC_P3 are simultaneously or substantially simultaneously activated.

At the time t1, the multi-plane read command MPR CMD is input through the data input/output line DQ. Then, the multi-plane read command MPR CMD is recognized by the command decoder 1241 (e.g., see FIG. 5), and the delay synchronization circuit 1243 is deactivated.

From time t2, the setup schedulers 1244, 1245, 1246, and 1247 will generate plane setup control signals X_DEC_P0, X_DEC_P1, X_DEC_P2, and X_DEC_P3 for simultaneously or substantially simultaneously setting up each plane. Then, setup of the word lines WLs_P0, WLs_P1, WLs_P2, and WLs_P3 of the planes PL0, PL1, PL2, and PL3 starts at the same or substantially the same time. Due to the simultaneous setup of multiple word lines, the setup time tDelay will become relatively long. Accordingly, data output may be delayed due to a delay until setup of the word line is completed, and a current peak may increase.

Data DOUT sensed from each of the planes PL0, PL1, PL2, and PL3 will be sequentially output from time t4. That is, the data sensed in the first plane P0 will be output for one output cycle tDOUT through the data input/output line DQ[7:0] between time t4 and time t5. Data sensed in the second plane P1 will be output for one output cycle tDOUT through the data input/output line DQ[7:0] between time t5 and time t6. Data sensed in the third plane P2 will be output for one output cycle tDOUT through the data input/output line DQ[7:0] between time t6 and time t7. Data sensed in the fourth plane P3 will be output for one output cycle tDOUT through the data input/output line DQ[7:0] between time t7 and time t8.

Figure 11:
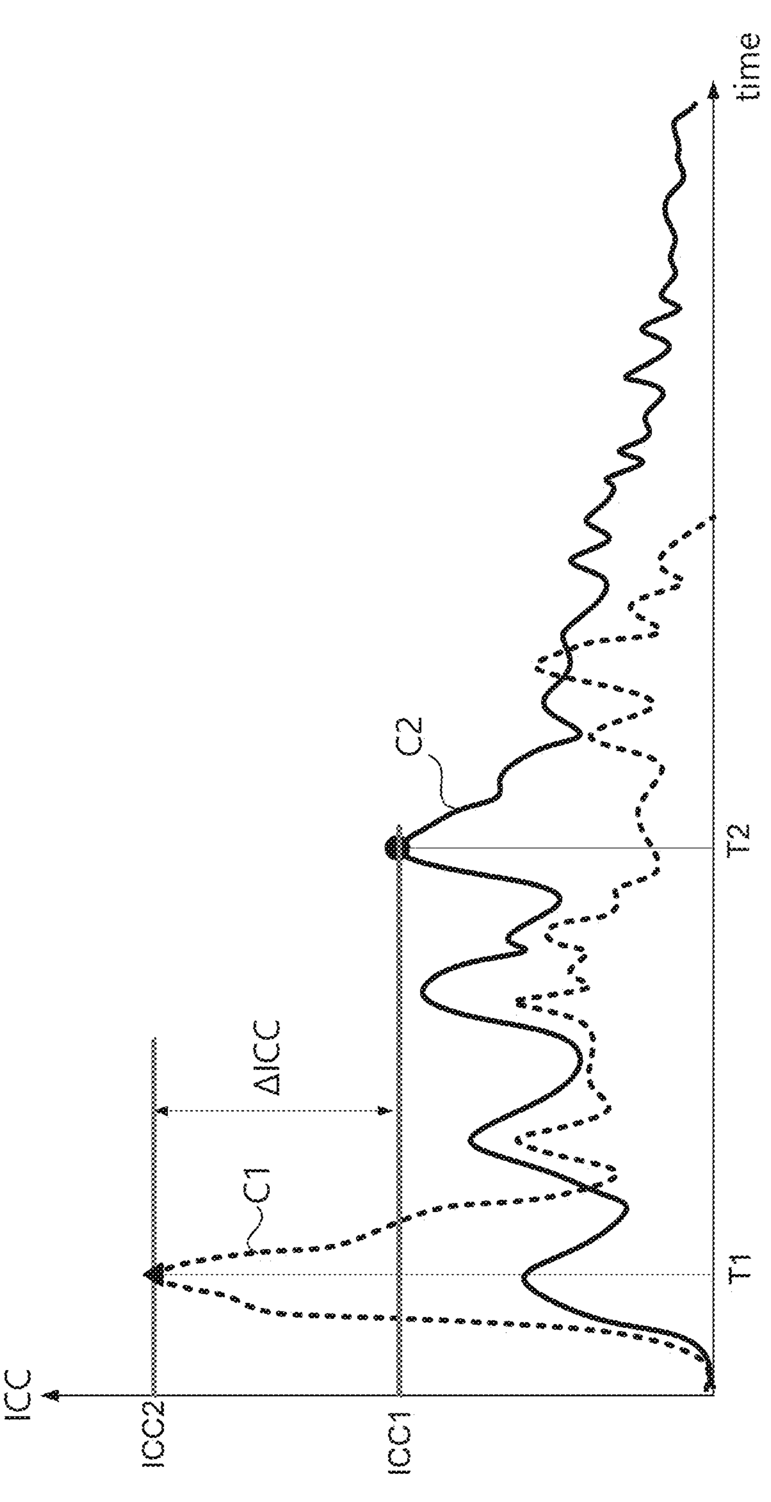
FIG. 11 is a graph briefly showing the effects of reducing a current peak generated during a read operation, according to an example embodiment.

FIG. 11 is a graph briefly showing the effects of reduced current peak in an example embodiment. Referring to FIG. 11, according to the pseudo independent plane read (PPIR) operation of the inventive concepts, a current peak generated during a read operation can be reduced.

Curve 'C1' shows the change in current during typical multi-plane read (MPR) operation with the pseudo plane independent read (PPIR) mode disabled. On the other hand, curve 'C2' shows a change in current generated during the pseudo plane independent read (PPIR) operation of the inventive concepts. During multi-plane read (MPR) operation, a current peak ICC2 is observed at time T1. During the pseudo plane independent read (PPIR) operation according to an example embodiment of the inventive concepts, a current peak ICC1 is observed at time T2. The difference ΔICC between the current peaks observed in the two curves C1 and C2 shows a relatively large value.

Figure 12:
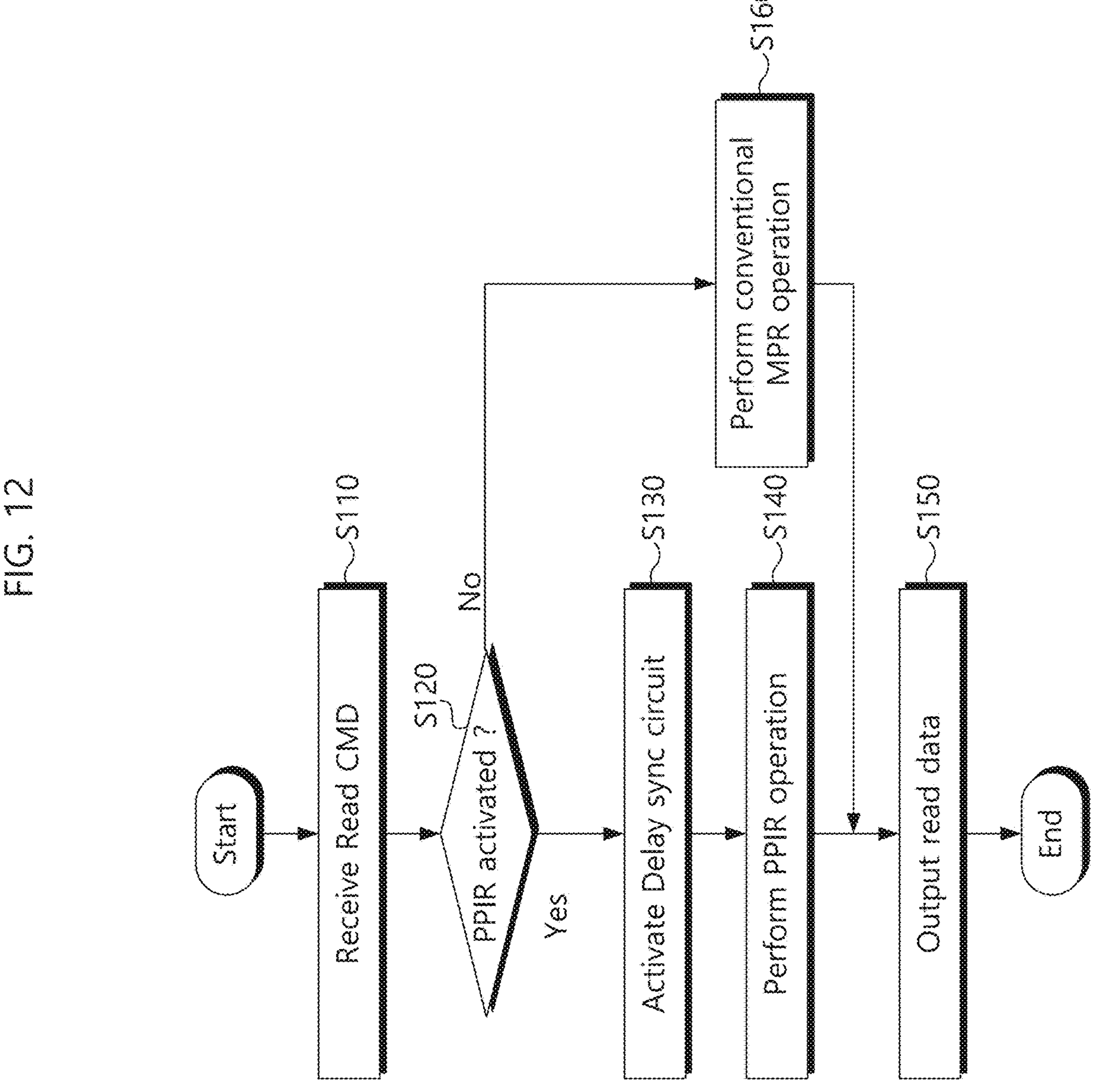
FIG. 12 is a flowchart illustrating a method of operating a nonvolatile memory device according to an example embodiment of the inventive concepts.

FIG. 12 is a flowchart illustrating a method of operating a nonvolatile memory device according to an example embodiment of the inventive concepts. Referring to FIG. 12, the nonvolatile memory device 1200 may perform a read operation for sequentially setting up plane word lines in a pseudo plane independent read (PPIR) mode.

In step S110, the control circuit 1240 (e.g., see FIG. 2) receives a read command Read CMD. Here, the read command may be a command for reading data from a plurality of planes. For example, the read command may be a multi-plane read command (MPR CMD).

In step S120, the control circuit 1240 checks whether a pseudo plane independent read (PPIR) mode currently set through set features is active. If the pseudo plane independent read (PPIR) mode is in an active state (Yes direction), the procedure moves to step S130. On the other hand, if the pseudo plane independent read (PPIR) mode is in an inactive state (No direction), the procedure moves to step S160.

In step S130, the control circuit 1240 enables the delay synchronization circuit 1243 (see FIG. 5). When the delay synchronization circuit 1243 is enabled, the plane setup control signals X_DEC_P0, X_DEC_P1, X_DEC_P2, and X_DEC_P3 are sequentially delayed and activated by a specific time difference tDelay.

In step S140, as the plane setup control signals X_DEC_P0, X_DEC_P1, X_DEC_P2, and X_DEC_P3 are sequentially delayed, word lines of the planes PL0, PL1, PL2, and PL3 are sequentially set up. Accordingly, a current peak according to word line setup may be reduced. As the word lines are sequentially set up, data stored in each of the planes PL0, PL1, PL2, and PL3 may be sensed.

In step S150, the sensed data is sequentially output in units of planes.

In step S160, the control circuit 1240 disables the delay synchronization circuit 1243. As the delay synchronization circuit 1243 is disabled, the plane setup control signals X_DEC_P0, X_DEC_P1, X_DEC_P2, and X_DEC_P3 are simultaneously or substantially simultaneously activated. Accordingly, word lines of each of the plurality of planes PL0, PL1, PL2, and PL3 are simultaneously or substantially simultaneously set up. Along with the setup of word lines, data stored in each of the planes PL0, PL1, PL2, and PL3 may be sensed. After that, the procedure moves to step S150.

In the above, the read operation procedure performed by the control circuit 1240 depending on whether the pseudo plane independent read (PPIR) mode is activated has been briefly described. According to an example embodiment of the inventive concepts, the nonvolatile memory device 1200 may reduce peak current without deterioration in read speed by sequentially delaying setup timing in plane units according to the pseudo plane independent read PPIR operation.

Figure 13:
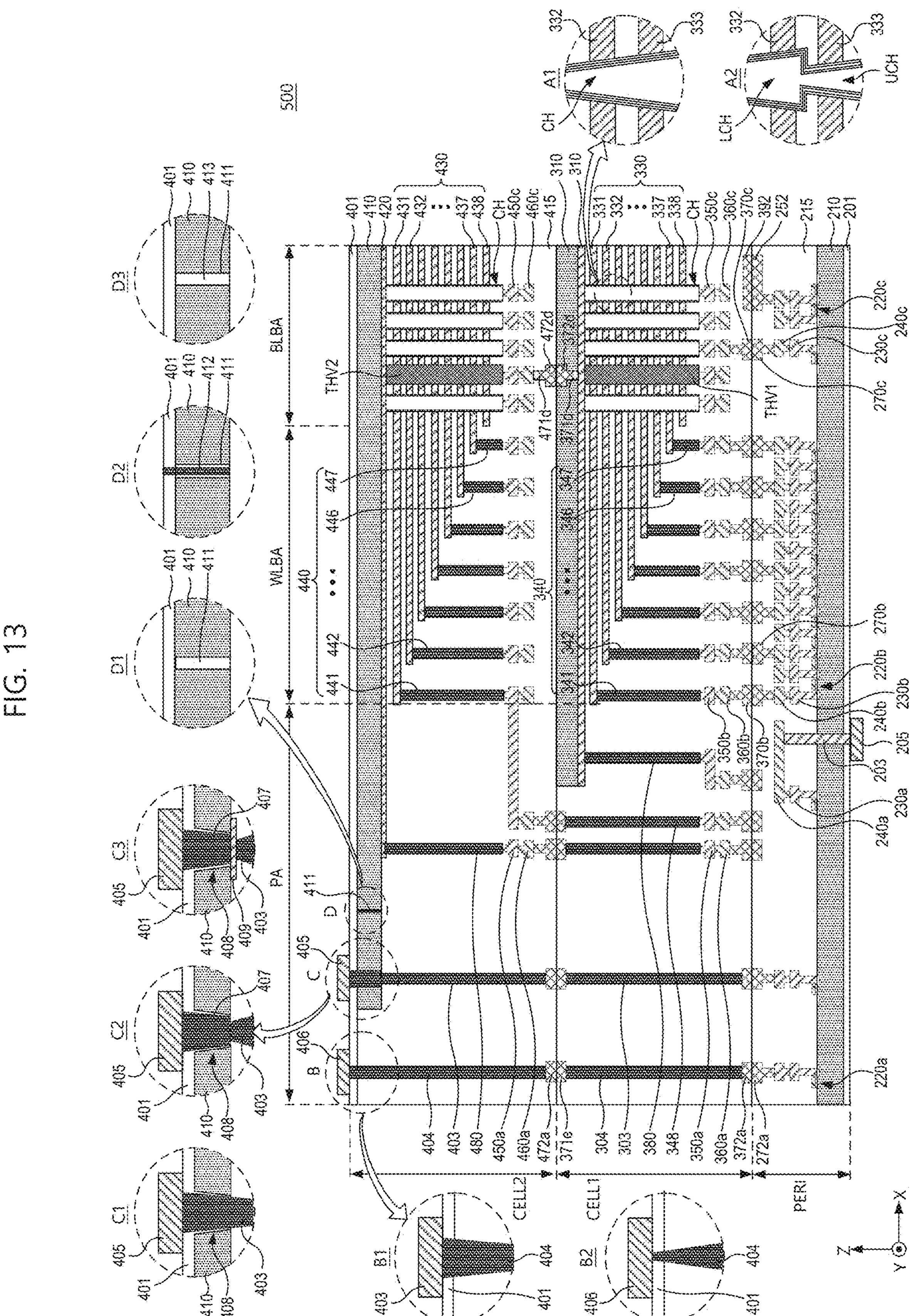
FIG. 13 is a diagram showing an example structure of a nonvolatile memory device according to an example embodiment of the inventive concepts.

FIG. 13 is a view illustrating a memory device 2000 according to some example embodiments of the inventive concepts. Referring to FIG. 13, the memory device 2000 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 2000 may include the at least one upper chip including the cell region. For example, as illustrated in FIG. 13, the memory device 2000 may include two upper chips. However, the number of the upper chips is not limited thereto. In the case in which the memory device 2000 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 2000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 13. However, example embodiments of the inventive concepts are not limited thereto. In some example embodiments, one of the first upper chip and the second upper chip may be turned over and then may be connected to a corresponding chip by the bonding method.

Each of the peripheral circuit region PERI and the first and second cell regions CELL1 and CELL2 of the memory device 2000 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the example embodiments. However, example embodiments of the inventive concepts are not limited thereto. In some example embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction e.g., the Z-axis direction) perpendicular or substantially perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (e.g., the Z-axis direction) perpendicular or substantially perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate, but example embodiments are not limited thereto. A plurality of channel structures CH may be formed in each of the first and second cell regions CELL1 and CELL2.

In some example embodiments, as illustrated in a region 'A1', the channel structure CH may be provided in the bit line bonding region BLBA and may extend in the direction perpendicular or substantially perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular or substantially perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 2000 according to the example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. Data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, example embodiments of the inventive concepts are not limited thereto. In some example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 13, the first through-electrode THV1 may penetrate the common source line 320 and the plurality of word lines 330. In some example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same or substantially the same shape and structure as the first through-electrode THV1.

In some example embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. The second through-electrode THV2 may be electrically connected to the third metal line 450*c* and the fourth metal line 460*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same or substantially the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 13, in the word line bonding region WLBA, the word lines 330 of the first cell region CELL1 may extend in a second direction (e.g., an X-axis direction) parallel or substantially parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some example embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten, but example embodiments are not limited thereto.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 13, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some example embodiments, the third substrate 410 may not be disposed in a region in which the input/output contact plug is disposed. For example, as illustrated in a region 'B', the third input/output contact plug 404 may be separated from the third substrate 410 in a direction parallel or substantially parallel to the top surface of the third substrate 410 and may penetrate an interlayer insulating layer 415 of the second cell region CELL2 so as to be connected to the third input/output pad 406. The third input/output contact plug 404 may be formed by at least one of various processes.

In some example embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some example embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some example embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. A connection structure of the second input/output contact plug 403 and the second input/output pad 405 may be realized by various methods.

In some example embodiments, as illustrated in a region 'C1', an opening 408 may be formed to penetrate the third substrate 410, and the second input/output contact plug 403 may be connected directly to the second input/output pad 405 through the opening 408 formed in the third substrate 410A as illustrated in the region 'C1', a diameter of the second input/output contact plug 403 may become progressively greater toward the second input/output pad 405. However, example embodiments of the inventive concepts are not limited thereto, and in some example embodiments, the diameter of the second input/output contact plug 403 may become progressively less toward the second input/output pad 405.

In some example embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. As illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some example embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in some example embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some example embodiments, as illustrated in a region 'D1', the slit 411 may be formed to penetrate the third substrate 410. For example, the slit 411 may be used to inhibit or prevent the third substrate 410 from being finely cracked when the opening 408 is formed. However, example embodiments of the inventive concepts are not limited thereto, and in some example embodiments, the slit 411 may be formed to have a depth ranging from about 60% to about 70% of a thickness of the third substrate 410.

In some example embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some example embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in some example embodiments, the first to third input/output pads 205, 405 and 406 may be selectively formed. For example, the memory device 2000 may be realized to include only the first input/output pad 205 disposed on the first substrate 210, to include only the second input/output pad 405 disposed on the third substrate 410, or to include only the third input/output pad 406 disposed on the upper insulating layer 401.

In some example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

The above are example embodiments for carrying out the inventive concepts. In addition to the above-described example embodiments, the inventive concepts may include simple design changes or easily changeable example embodiments. In addition, the inventive concepts may include techniques that can be easily modified and implemented using the example embodiments. Therefore, the scope of the inventive concepts should not be limited to the above-described example embodiments.

What is claimed is:

1. A nonvolatile memory device, comprising:

a cell array divided into a plurality of planes;

a voltage generator configured to generate a plurality of word line voltages, each word line voltage of the plurality of word line voltages applied to a plurality of word lines of each plane of the plurality of planes;

a row decoder configured to transmit the plurality of word line voltages to the cell array in response to an address; and a control circuit configured to set up word line voltages of each plane of the plurality of planes in response to an activated pseudo plane independent read mode setting, wherein the control circuit, in response to receiving a multi-plane command, is configured to sequentially shift voltage setup times of selected word lines of the plurality of word lines by a specified time delay corresponding to a number of selected planes of the plurality of planes, the selected planes including the selected word lines, the selected planes corresponding to the multi-plane command.

2. The device of claim 1, wherein the specified time delay corresponds to a cycle in which data sensed from one of the plurality of planes in a data input/output line is output.

3. The device of claim 1, wherein the voltage generator comprises:

a charge pump configured to boost a power supply voltage in response to an enable signal from the control circuit to provide a boosted power supply voltage; and a plurality of word line voltage generators, each word line voltage generator of the plurality of word line voltage generators configured to generate a word line voltage of the plurality of word line voltages transmitted to each plane of the plurality of planes using the boosted power supply voltage.

4. The device of claim 3, wherein the row decoder comprises a plurality of plane unit row decoders configured to transfer each word line voltage of the plurality of word line voltages to word lines of each plane of the plurality of planes in response to plane setup control signals received from the control circuit.

5. The device of claim 4, wherein the control circuit comprises:

a command decoder configured to decode a read command;

a delay synchronization circuit configured to activate or deactivate according to the pseudo plane independent read mode setting; and a plurality of setup schedulers configured to generate the plane setup control signals for switching the plurality of plane unit row decoders under control of the delay synchronization circuit.

6. The device of claim 5, wherein the plane setup control signals are sequentially shifted by the specified time delay in response to activation of the delay synchronization circuit.

7. The device of claim 1, further comprising:

a page buffer circuit configured to control bit lines of each of the plurality of planes and sense stored data according to control of the control circuit.

8. The device of claim 1, wherein the plurality of word line voltages includes a read voltage or a read pass voltage for sensing memory cells.

9. A method for operating a nonvolatile memory device including a plurality of planes, the method comprising:

receiving a multi-plane input command;

determining whether a pseudo plane independent read mode is activated in response to receiving the multi-plane input command; and in response to determining that the pseudo plane independent read mode is activated and receiving the multi-plane input command, setting up a plurality of word line voltages of each plane of the plurality of planes to a specified word line voltage, wherein voltage setup times of word lines are sequentially shifted by a specified time delay corresponding to a number of selected planes of the plurality of planes.

10. The method of claim 9, wherein the specified time delay corresponds to a cycle in which data sensed from one of the plurality of planes is output from a data input/output line of the nonvolatile memory device.

11. The method of claim 9, wherein setting up word line voltages of each of the plurality of planes as specified word line voltages comprises:

generating each word line voltage of the plurality of word line voltages using a charge pump;

generating a plurality of plane setup control signals that are sequentially activated according to the specified time delay in response to the multi-plane input command; and sequentially setting up voltages of word lines of each of the plurality of planes according to the plurality of plane setup control signals.

12. The method of claim 11, wherein each word line voltage of the plurality of word line voltages is sequentially switched to word lines of each of the plurality of planes in response to each of the plurality of plane setup control signals.

13. The method of claim 11, wherein the plurality of word line voltages includes a read voltage or a read pass voltage of memory cells.

14. A nonvolatile memory device comprising:

a cell array including a first plane and a second plane;

a first plane row decoder configured to transmit a word line voltage to the first plane;

a second plane row decoder configured to transmit the word line voltage to the second plane; and a control circuit configured to set up voltages of word lines of the first plane and the second plane with the word line voltage at different points of time in response to a multi-plane read command, wherein setting up the word line voltage of the second plane occurs at a time shifted by a specified time delay corresponding to a number of planes selected by the multi-plane read command after transmitting the word line voltage of the first plane.

15. The device of claim 14, wherein the specified time delay corresponds to a cycle in which data sensed in one of the first plane and the second plane is output to a data input/output line.

16. The device of claim 14, wherein the control circuit comprises:

a command decoder configured to decode the multi-plane read command;

a delay sync circuit configured to activate or deactivate according to the command decoder and a pseudo plane independent read mode setting; and a setup scheduler configured to generate a first setup control signal for switching the first plane row decoder and a second setup control signal for switching the second plane row decoder according to control of a delay synchronization circuit.

17. The device of claim 16, wherein the first setup control signal and the second setup control signal are configured to activated at different points of time in response activation of the delay synchronization circuit.

18. The device of claim 17, wherein the first plane row decoder includes a plurality of pass transistors configured to switch the word line voltage of the first plane to the word lines of the first plane in response to the first setup control signal.

19. The device of claim 14, further comprising:

a voltage generator configured to generate the word line voltage using a charge pump.

* * * * *